US011251026B2

(12) United States Patent
Cue et al.

(10) Patent No.: US 11,251,026 B2
(45) Date of Patent: Feb. 15, 2022

(54) MATERIAL DEPOSITION PREVENTION ON A WORKPIECE IN A PROCESS CHAMBER

(71) Applicants: Mattson Technology, Inc., Fremont, CA (US); Beijing E-Town Semiconductor Technology Co., Ltd., Beijing (CN)

(72) Inventors: Jeffrey Cue, Fremont, CA (US); Martin L. Zucker, Orinda, CA (US)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 115 days.

(21) Appl. No.: 15/936,764

(22) Filed: Mar. 27, 2018

(65) Prior Publication Data
US 2018/0286640 A1     Oct. 4, 2018

Related U.S. Application Data

(60) Provisional application No. 62/479,778, filed on Mar. 31, 2017.

(51) Int. Cl.
*H01J 37/32*     (2006.01)
*H01L 21/67*     (2006.01)
(Continued)

(52) U.S. Cl.
CPC .... *H01J 37/32642* (2013.01); *H01J 37/3244* (2013.01); *H01J 37/32091* (2013.01);
(Continued)

(58) Field of Classification Search
CPC ............ H01J 37/32642; H01J 37/3244; H01J 37/32091; H01J 37/32651;
(Continued)

(56) References Cited

U.S. PATENT DOCUMENTS

| 6,022,809 A | 2/2000 | Fan |
| 7,381,293 B2 | 6/2008 | Wang et al. |

(Continued)

FOREIGN PATENT DOCUMENTS

| CN | 104715997 | 6/2015 |
| JP | 2005-531157 A | 10/2005 |

(Continued)

OTHER PUBLICATIONS

PCT International Search Report and Written Opinion for corresponding PCT Application No. PCT/US2018/024445, dated Jul. 13, 2018—11 pages.

*Primary Examiner* — Ram N Kackar
(74) *Attorney, Agent, or Firm* — Dority & Manning, P.A.

(57) ABSTRACT

Focus ring assemblies for plasma processing apparatus are provided. In one example implementation, an apparatus includes a plasma source configured to generate a plasma. The apparatus includes a chamber configured to receive a workpiece. The apparatus includes a workpiece support contained in the chamber and configured to support the workpiece. The apparatus includes a focus ring assembly. The focus ring assembly includes a focus ring having an upper tier and a lower tier. An inner edge of the upper tier can be separated a lateral distance of at least about 3 mm from an outer edge of the workpiece located on the workpiece support.

16 Claims, 4 Drawing Sheets

(51) Int. Cl.
*H01L 21/683* (2006.01)
*H01L 21/687* (2006.01)

(52) U.S. Cl.
CPC .. *H01J 37/32651* (2013.01); *H01J 37/32715* (2013.01); *H01L 21/67069* (2013.01); *H01L 21/6831* (2013.01); *H01L 21/68735* (2013.01); *H01J 2237/334* (2013.01)

(58) Field of Classification Search
CPC .......... H01J 37/32715; H01J 2237/334; H01L 21/68735; H01L 21/67069; H01L 21/6831
USPC ........................................................ 156/915
See application file for complete search history.

(56) References Cited

U.S. PATENT DOCUMENTS

| | | | |
|---|---|---|---|
| 8,382,942 B2 | 2/2013 | Hatamura et al. | |
| 8,405,005 B2 | 3/2013 | Zucker et al. | |
| 8,801,947 B2 | 8/2014 | Wang et al. | |
| 9,653,264 B2 | 5/2017 | Nagorny et al. | |
| 2003/0019584 A1* | 1/2003 | Choi | H01L 21/67069 156/345.51 |
| 2004/0002221 A1 | 1/2004 | O'Donnell et al. | |
| 2005/0155718 A1* | 7/2005 | Huang | H01J 37/32633 216/34 |
| 2006/0043067 A1* | 3/2006 | Kadkhodayan | H01J 37/32642 216/67 |
| 2007/0032081 A1* | 2/2007 | Chang | H01L 21/467 438/689 |
| 2007/0215279 A1* | 9/2007 | Koshiishi | H01J 37/32623 156/345.3 |
| 2010/0041240 A1* | 2/2010 | Tsujimoto | H01J 37/32642 438/758 |
| 2011/0048643 A1* | 3/2011 | Endoh | H01J 37/32642 156/345.41 |
| 2011/0126984 A1* | 6/2011 | Kang | H01J 37/32091 156/345.51 |
| 2012/0216955 A1* | 8/2012 | Eto | C23C 16/4404 156/345.51 |
| 2016/0379796 A1* | 12/2016 | Koshimizu | H01J 37/32449 315/111.01 |
| 2017/0053820 A1 | 2/2017 | Bosch et al. | |
| 2017/0213758 A1* | 7/2017 | Rice | H01J 37/32091 |
| 2018/0190526 A1* | 7/2018 | Hao | H01L 21/6831 |

FOREIGN PATENT DOCUMENTS

| | | |
|---|---|---|
| JP | 2007-250967 A | 9/2007 |
| JP | 2010-045200 | 2/2010 |
| JP | 2010-232694 A | 10/2010 |
| KR | 20070094522 | 9/2007 |
| KR | 20080029569 | 4/2008 |

* cited by examiner

MATERIAL DEPOSITION PREVENTION ON A WORKPIECE IN A PROCESS CHAMBER

PRIORITY CLAIM

The present application claims the benefit of priority of U.S. Provisional Application Ser. No. 62/479,778, titled "Material Deposition Prevention on a Substrate in a Process Chamber," filed Mar. 31, 2017, which is incorporated herein by reference for all purposes.

FIELD

The present disclosure relates generally to plasma processing of workpieces, such as semiconductor workpieces.

BACKGROUND

Plasma processing is widely used in the semiconductor industry for deposition, etching, resist removal, and related processing of semiconductor wafers and other workpieces. Plasma sources (e.g., microwave, ECR, inductive, etc.) are often used for plasma processing to produce high density plasma and reactive species for processing workpieces. RF plasma sources can be used in plasma etch applications because of the ability of the RF plasma source to generate a process chemistry out of feed gases, and to provide an isotropic or highly anisotropic etch at high or low etch rates. Plasma processing tools can be able to sustain a stable plasma in very different gases and under very different conditions (gas flow, gas pressure, etc.) and can provide for independent control of plasma density, plasma profile and ion energy.

SUMMARY

Aspects and advantages of embodiments of the present disclosure will be set forth in part in the following description, or may be learned from the description, or may be learned through practice of the embodiments.

One example aspect of the present disclosure is directed to a workpiece processing apparatus. The apparatus includes a plasma source configured to generate a plasma. The workpiece processing apparatus includes a chamber configured to receive a workpiece. The workpiece processing apparatus includes a workpiece support contained in the chamber and configured to support the workpiece. The workpiece processing apparatus includes a focus ring assembly. The focus ring assembly includes a focus ring having an upper tier and a lower tier. An inner edge of the upper tier can be separated a lateral distance of at least about 3 mm from an outer edge of the workpiece located on the workpiece support.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to a focus ring assembly and plasma processing apparatus containing a focus ring assembly. Aspects of the present disclosure can have beneficial utility in preventing or reducing the rate of accumulation of materials on a focus ring assembly. Some embodiments can have beneficial utility in preventing or reducing the rate of accumulation of materials on a focus ring, a workpiece, and/or an electrostatic chuck.

In some plasma processing systems, such as plasma etch tools, a workpiece can be generally positioned in a process chamber and can be supported by a workpiece support. The workpiece support can include, in some embodiments, an electrostatic chuck. A focus ring assembly, part of which may be referred to as a shadow ring, can be used for achieving a more uniform plasma distribution over the entire surface of the workpiece and to help direct the distribution of the plasma to stay at the workpiece surface. The focus ring assembly can also implement sealing at the workpiece level to separate an upper portion of the processing chamber where plasma is generated from a lower portion of the processing chamber. This can prevent plasma from entering the lower portion of the processing chamber, reducing plasma exposure to components contained in the lower compartment of the etch chamber.

In some implementations, a focus ring can be interposed between an outer ring or a shadow ring and an electrostatic chuck or other workpiece support. The combination of a focus ring and an outer ring can enhance uniformity of the etch rate of the workpiece. The workpiece may extend over the edge of the workpiece support or electrostatic chuck and can also extend over a gap. The gap can be defined between an inner side of the focus ring, a bottom side of the workpiece, a bottom side of the workpiece support, and an outer side of the workpiece support. Through repeated processing of successive workpieces on a workpiece support, a deposit of material tends to accumulate on a bottom surface of the workpiece, a bottom surface of the workpiece support, an outer edge of the workpiece support, and/or the inner side of the focus ring. This can lead to a closing and/or narrowing of the gap.

The accumulation can disrupt the etch process, as well as damage the workpiece or the ring assembly. Specific concerns can include a disruption in the circulation of cooling helium throughout the chamber, accumulation of the material on the workpiece, workpiece support, or focus ring which causes peeling of the material, and flaking of material onto the workpiece. Attempts have been made to deposit material accumulation by narrowing the gap or by providing narrow perpendicular flow spaces, but the problem persists.

Example embodiments of the present disclosure can include a plasma processing apparatus. The plasma processing processing apparatus can include, for instance, gas inlet or supply, direct or indirect plasma sources, chambers with pressure control for high pressure and low pressure systems, electrodes which may be located on the top, sides, or remotely downstream from the chamber and which may have sources such as radio frequency or other power generators, as well as cooling systems for circulating a fluid (e.g., water, helium, etc.) to cool components. The plasma processing apparatus, in some embodiments, may include a processing region, inlets and/or outlets for affecting circulation of gasses and vapors and the like.

Plasma sources for workpiece processing apparatus can include, for instance, inductive plasma sources to produce high density plasma and reactive species. For instance, inductive plasma sources can produce high density plasma using standard 13.56 MHz and lower frequency power generators. Inductive plasma sources combined with RF bias have also been used in plasma etching tools, for example, to provide independent control of ion energy and ion flux to the wafer.

Although in some embodiments the workpiece can be directly exposed to a plasma, in some embodiments, a plasma is produced downstream and filtered prior to contacting the workpiece. In this regard, the plasma can be formed remotely from the processing chamber. After the plasma is formed, the desired particles or reactive species are channeled to the workpiece. For example, in some embodiments, a filter structure or grid can be used that is transparent to neutral particles that form the reactive species and not transparent to the plasma. Such processes can require high RF power, such as up to about 6000 watts, and in some cases relatively high gas flows and pressure. For instance, the gas flow rate can be about 20,000 standard cubic centimeters per minute and the pressure can be up to about 5,000 milliTorr.

The plasma processing apparatus can include a workpiece support for supporting a workpiece. In some embodiments, the workpiece support may be an electrostatic chuck. The term electrostatic chuck is meant to include all types of electrostatic clamps. The workpiece support may be bonded to a base plate of the workpiece processing chamber or alternatively may be removably attached. In some embodiments, the workpiece support may be configured to engage with a focus ring assembly, or at least a portion of a focus ring assembly. Alternatively, the workpiece support may not engage with the focus ring assembly. The workpiece holder and/or baseplate may also be configured to allow for heating or cooling of the workpiece.

In some embodiments, the workpiece support can be adapted to rotate the workpiece during processing. Rotating the workpiece promotes greater temperature uniformity over the surface of the workpiece and promotes enhanced contact between the workpiece and the reactive species introduced into the chamber. In some embodiments, however, the workpiece may remain stationary during processing.

The workpiece support may also be configured to support a variety of workpieces. The workpiece support may support workpieces that have a diameter of at least 100 mm such as at least 200 mm such as at least 300 mm workpieces, such as at least 450 mm workpieces or larger, and such as less than 1000 mm, such as less than 900 mm, such as less than 800 mm, such as less than 700 mm, and such as less than 600 mm, or any range selected from 25 mm increments therein.

The workpiece may have a diameter that is larger than the diameter of the workpiece support, or in the alternative, it may have a diameter that is smaller than the diameter of the workpiece support. If a workpiece has a diameter that is larger than the diameter of the workpiece support, the workpiece can extend beyond the workpiece support and overhang the process chamber or focus ring assembly. In such an embodiment, the workpiece support and focus ring assembly may form a gap which may extend between the workpiece and the focus ring assembly and can extend at a perpendicular angle along the inner side of the workpiece support. Through repeated processing of workpieces, material may deposit or accumulate in the gap. This material deposit may cause material to flake off during processing or may block the gap. A blockage of the gap may disrupt a cooling process or disrupt the circulation below the workpiece.

Example embodiments of the present disclosure increase a distance between an upper tier of a focus ring and the workpiece. Previous attempts to reduce material deposit have included decreasing the distance between a focus ring and the workpiece including creating narrow, perpendicular flow spaces. While the present disclosure has many advantages, and without being bound to a single embodiment, the present disclosure has discovered that increasing the space between a focus ring and a workpiece decreases material deposit or alternatively allows for monitoring and cleaning during processing.

In some embodiments, a ramped side wall can be included between an upper and lower tier of a focus ring. The side wall can be generally perpendicular (e.g., within 15 degrees of perpendicular). The length and angle of the ramp may be selected based upon the thickness of the focus ring or may be a fixed angle or ramp length applied to a focus ring of any thickness or size. While in some embodiments, the focus ring may be substantially flat, in other embodiments the focus ring may have a standard thickness or may have a substantial thickness.

The focus ring assembly according to example aspects of the present disclosure can include a single ring, or alternatively it can include multiple rings. In embodiments with multiple rings, every ring may include the same material or in some embodiments, each ring may be made of a separate material. In some embodiments, a portion of the rings may be made of the same or similar material while one or multiple rings are made of a separate material. In embodiments with, each ring may have substantially the same shape and/or size, or alternatively each ring may have a different shape and/or size. In some embodiments, some of the rings may have the same or a similar shape and/or size while one or multiple rings have a different shape and/or size.

In some embodiments, the focus ring assembly can be configured to be associated with a workpiece support or baseplate. A ring(s) of the focus ring assembly can associate with other rings or with the workpiece support or baseplate by using steps, indentations, or similarly sized bottom portions so as to engage with a portion of another ring, workpiece support or baseplate. Other types of association or engagement may be used for releasable or more permanent associations between the rings, workpiece support, and baseplate.

In a focus ring assembly with multiple rings, multiple rings may be configured to associate with a workpiece support or baseplate, or, only a single ring may be configured to associate with a workpiece support or baseplate. In a further embodiment, the focus ring assembly, or any ring therein, may be configured to associate with the processing chamber. In yet a further embodiment, a focus ring assembly with multiple rings may be configured to be self-supported through association with one or multiple rings in the focus ring assembly.

One example embodiment of the present disclosure is directed to a workpiece processing apparatus. The apparatus includes a plasma source configured to generate a plasma. The workpiece processing apparatus includes a chamber configured to receive a workpiece. The workpiece processing apparatus includes a workpiece support contained in the chamber and configured to support the workpiece. The workpiece processing apparatus includes a focus ring assembly. The focus ring assembly includes a focus ring having an upper tier and a lower tier. An inner edge of the upper tier can be separated a lateral distance of at least about 3 mm from an outer edge of the workpiece located on the workpiece support.

In some embodiments, the lateral distance can be at least about 6 mm. In some embodiments, the lateral distance is in a range from at least about 7 mm to about 15 mm.

In some embodiments, the focus ring further includes a side wall between the upper tire and lower tire of the focus ring. An angle between the side wall and an upper surface of the lower tier can be in the range of about 100 degrees to about 150 degrees. In some embodiments, the angle between the side wall and the upper surface of the lower tier is about 90 degrees.

In some embodiments, the focus ring can include silicon. In some embodiments the focus ring can include yttria.

In some embodiments, the workpiece support can include an electrostatic chuck bonded to a baseplate. In some embodiments, the focus ring assembly includes an outer ring adjacent to a side wall of the chamber. The focus ring assembly includes an inner ring adjacent to a baseplate of the workpiece. The focus ring assembly can include an upper ring located laterally in the ring assembly between the outer ring and the baseplate and vertically located in the ring assembly between the baseplate and the focus ring.

In some embodiments, the inner ring can include quartz. In some embodiments, the upper ring can include quartz. In some embodiments, the outer ring can be an insulating material.

In some embodiments, a top surface of the upper tier of the focus ring is substantially planar with a top surface of the workpiece. In some embodiments, an edge of the workpiece overhangs an edge of the workpiece support to define a gap between an upper surface of the lower tier of the focus ring and a bottom surface of the workpiece. In some embodiments, the focus ring defines a viewing angle into the gap.

Another example embodiment of the present disclosure is directed to a focus ring for encircling a workpiece support in a process chamber. The focus ring can have an upper tier and a lower tier. A lateral distance can be defined between an inner edge of the upper tier of the focus ring and a workpiece with the workpiece is supported by the workpiece support in the process chamber. The lateral distance can have a ratio of 4:1 with a thickness of the workpiece.

Another example embodiment of the present disclosure is directed to a focus ring for encircling a workpiece support in a process chamber. The focus ring can have an upper tier and a lower tier. A lateral distance can be defined between an inner edge of the upper tier of the focus ring and a workpiece with the workpiece is supported by the workpiece support in the process chamber. The lateral distance can be at least about 6 mm.

In some embodiments, the focus ring can include a side wall between the upper tire and lower tire of the focus ring. An angle between the side wall and an upper surface of the lower tier can be in the range of about 90 degrees to about 150 degrees. In some embodiments, the focus ring can include silicon. In some embodiments, the focus ring can include yttria.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece.

Figure 1:
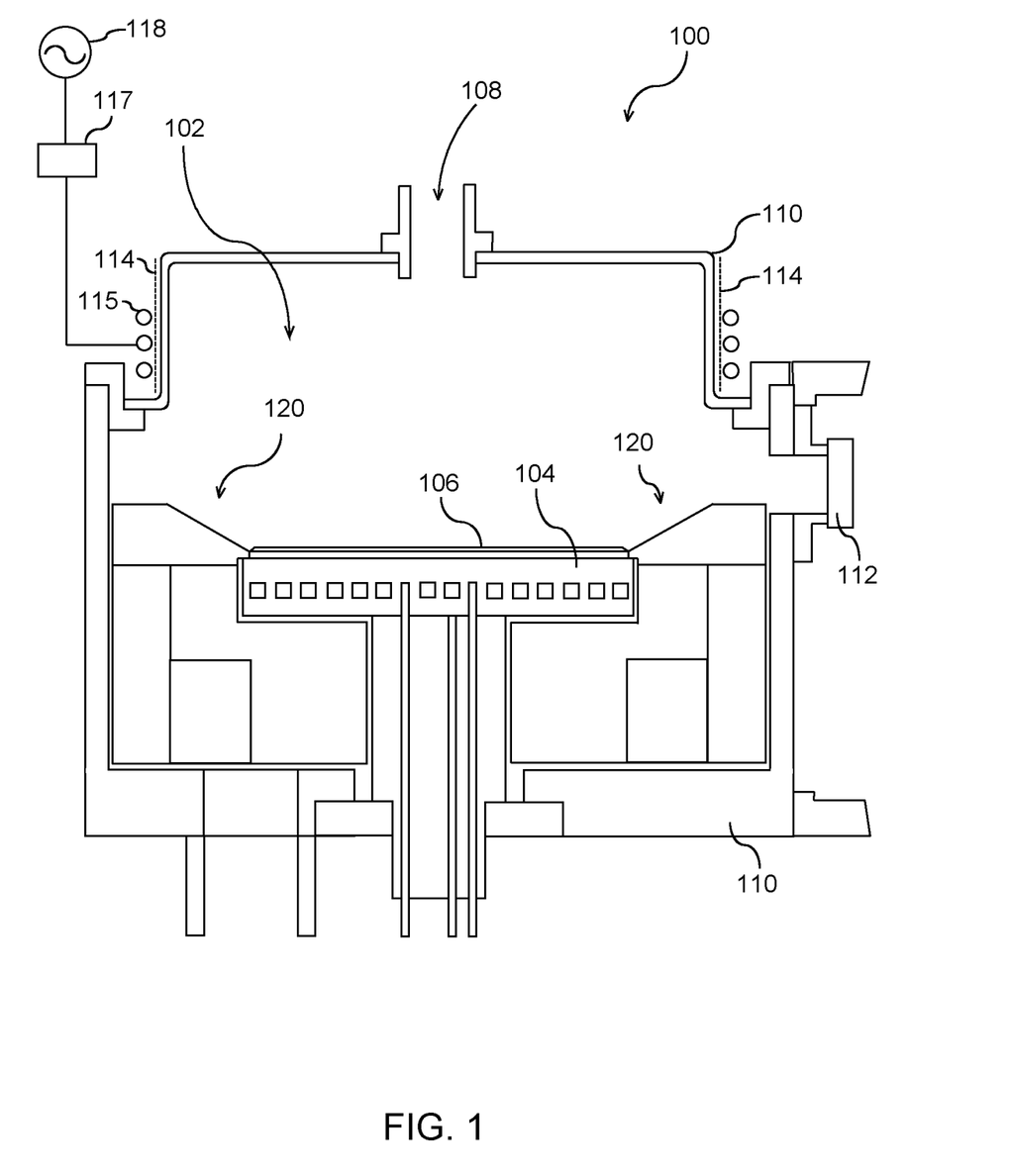
FIG. 1 depicts a plasma processing apparatus according to example embodiments of the present disclosure.

FIG. 1 depicts an example plasma processing apparatus 100 according to example aspects of the present disclosure. Aspects of the present disclosure are discussed with reference to the plasma processing apparatus 100 for purposes of illustration and discussion. Those of ordinary skill in the art, using the disclosures provided herein, will understand that various aspects of any of the embodiments described herein can be implemented in other apparatus and/or systems without deviating from the scope of the present disclosure.

The plasma processing apparatus 100 includes a processing chamber 102. The processing chamber includes a workpiece support 104 operable to support a workpiece 106, such as a semiconductor wafer. The plasma processing apparatus 100 includes a focus ring assembly 120.

The processing chamber 102 may include a dielectric side wall 110. The dielectric side wall 110 can be formed from any dielectric material, such as quartz. An induction coil 115 may be disposed adjacent the dielectric side wall 110 about the process chamber 102. An induction coil 115 is coupled to a power generator, such as a RF power generator 118 via a suitable matching network 117. Reactant and carrier gases may be provided to the chamber interior from gas supply 108. In some embodiments, the workpiece processing apparatus 100 can include an optional Faraday shield 114 to reduce capacitive coupling of the induction coil to the plasma and may include a vacuum 112 to remove reaction products or unreacted species.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

Figure 2:
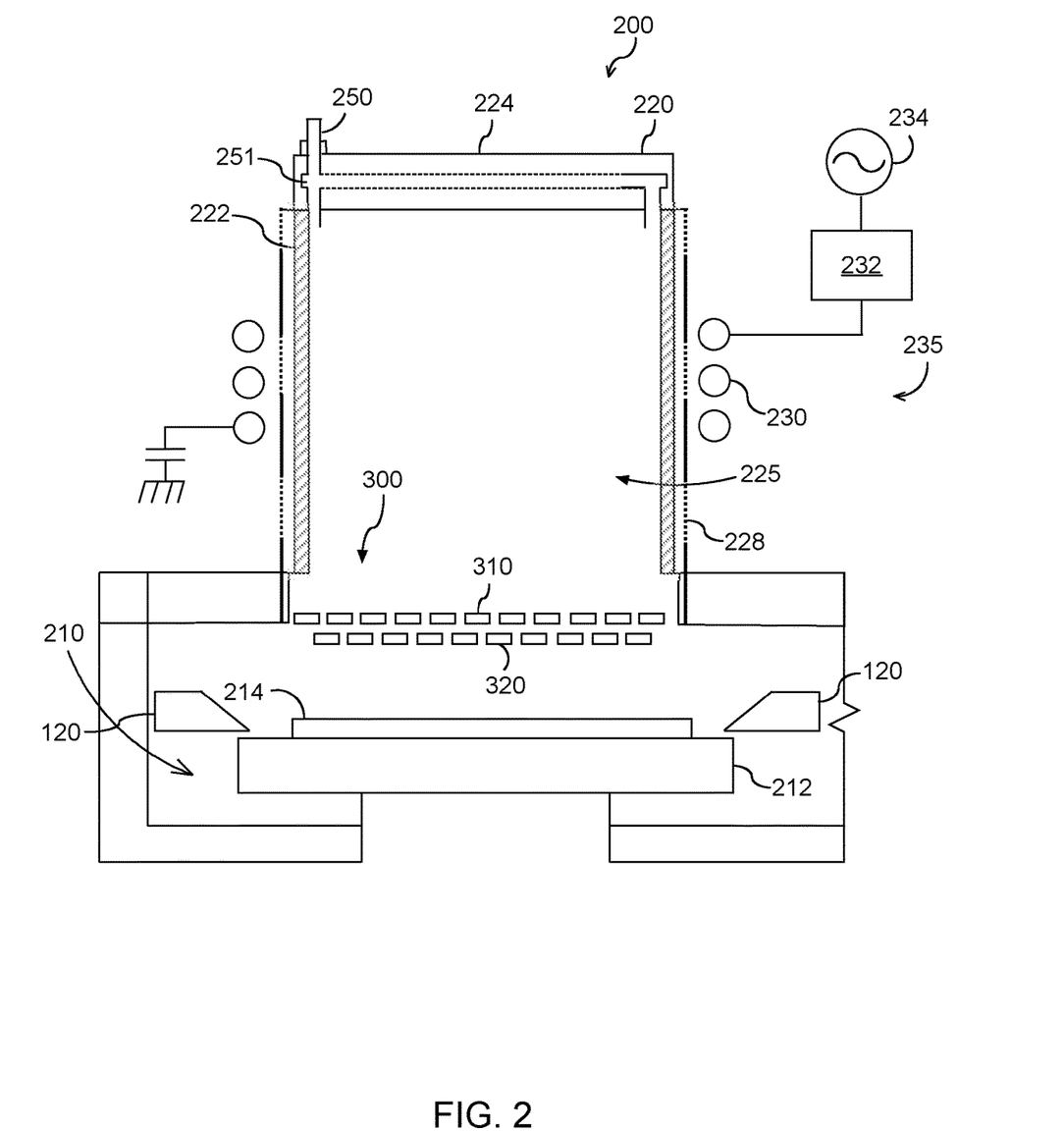
FIG. 2 depicts a plasma processing apparatus according to example embodiments of the present disclosure.

In addition, aspects of the present disclosure can be used with other types of plasma processing apparatus, such as a downstream inductive plasma reactor, such as the plasma processing apparatus 200 shown in FIG. 2. As illustrated, plasma processing apparatus 200 includes a processing chamber 210 and a plasma chamber 220 that is separated from the processing chamber 210. Processing chamber 210 includes a substrate holder or pedestal 212 operable to hold a workpiece 214 to be processed, such as a semiconductor wafer. In this example illustration, a plasma is generated in plasma chamber 220 (i.e., plasma generation region) by an inductively coupled plasma source 235 and desired species are channeled from the plasma chamber 220 to the surface of substrate 214 through a separation grid assembly 300.

The plasma chamber 220 includes a dielectric side wall 222 and a ceiling 224. The dielectric side wall 222, ceiling 224, and separation grid 300 define a plasma chamber interior 225. Dielectric side wall 222 can be formed from a dielectric material, such as quartz and/or alumina. The inductively coupled plasma source 235 can include an induction coil 230 disposed adjacent the dielectric side wall 222 about the plasma chamber 220. The induction coil 230 is coupled to an RF power generator 234 through a suitable matching network 232. Process gases (e.g., reactant and carrier gases) can be provided to the chamber interior from gas supply 250 and annular gas distribution channel 251 or other suitable gas introduction mechanism. When the induction coil 230 is energized with RF power from the RF power generator 234, a plasma can be generated in the plasma chamber 220. In a particular embodiment, the plasma processing apparatus 200 can include an optional grounded Faraday shield 228 to reduce capacitive coupling of the induction coil 230 to the plasma.

As shown in FIG. 2, a separation grid 300 separates the plasma chamber 120 from the processing chamber 210. The separation grid 300 can be used to perform ion filtering from a mixture generated by plasma in the plasma chamber 220 to generate a filtered mixture. The filtered mixture can be exposed to the workpiece 214 in the processing chamber.

In some embodiments, the separation grid 300 can be a multi-plate separation grid. For instance, the separation grid 300 can include a first grid plate 310 and a second grid plate 320 that are spaced apart in parallel relationship to one another. The first grid plate 310 and the second grid plate 320 can be separated by a distance.

The first grid plate 310 can have a first grid pattern having a plurality of holes. The second grid plate 320 can have a second grid pattern having a plurality of holes. The first grid pattern can be the same as or different from the second grid pattern. Charged particles can recombine on the walls in their path through the holes of each grid plate 310, 320 in the separation grid. Neutral particles (e.g., radicals) can flow relatively freely through the holes in the first grid plate 310 and the second grid plate 320. The size of the holes and thickness of each grid plate 310 and 320 can affect transparency for both charged and neutral particles.

In some embodiments, the first grid plate 310 can be made of metal (e.g., aluminum) or other electrically conductive material and/or the second grid plate 320 can be made from either an electrically conductive material or dielectric material (e.g., quartz, ceramic, etc.). In some embodiments, the first grid plate 310 and/or the second grid plate 320 can be made of other materials, such as silicon or silicon carbide. In the event a grid plate is made of metal or other electrically conductive material, the grid plate can be grounded.

AS shown in FIGS. 1 and 2, the plasma processing apparatus can include a focus ring assembly 120 which may be used with processing chambers as described above. Focus ring assemblies 120 may comprise a single ring or the assembly may comprise multiple rings or parts. The focus ring assembly 120 may serve to generally encircle a workpiece and/or workpiece support, separate the processing chamber from the baseplate and further chamber components, and may provide insulating and deflective properties. The focus ring assembly 120, or any part or parts thereof, may be comprised of an insulating material, ceramic material, or any other suitable material. In certain embodiments, the focus ring assembly 120, or any part or parts thereof may be formed of silicon, yttria, or quartz.

Figure 3:
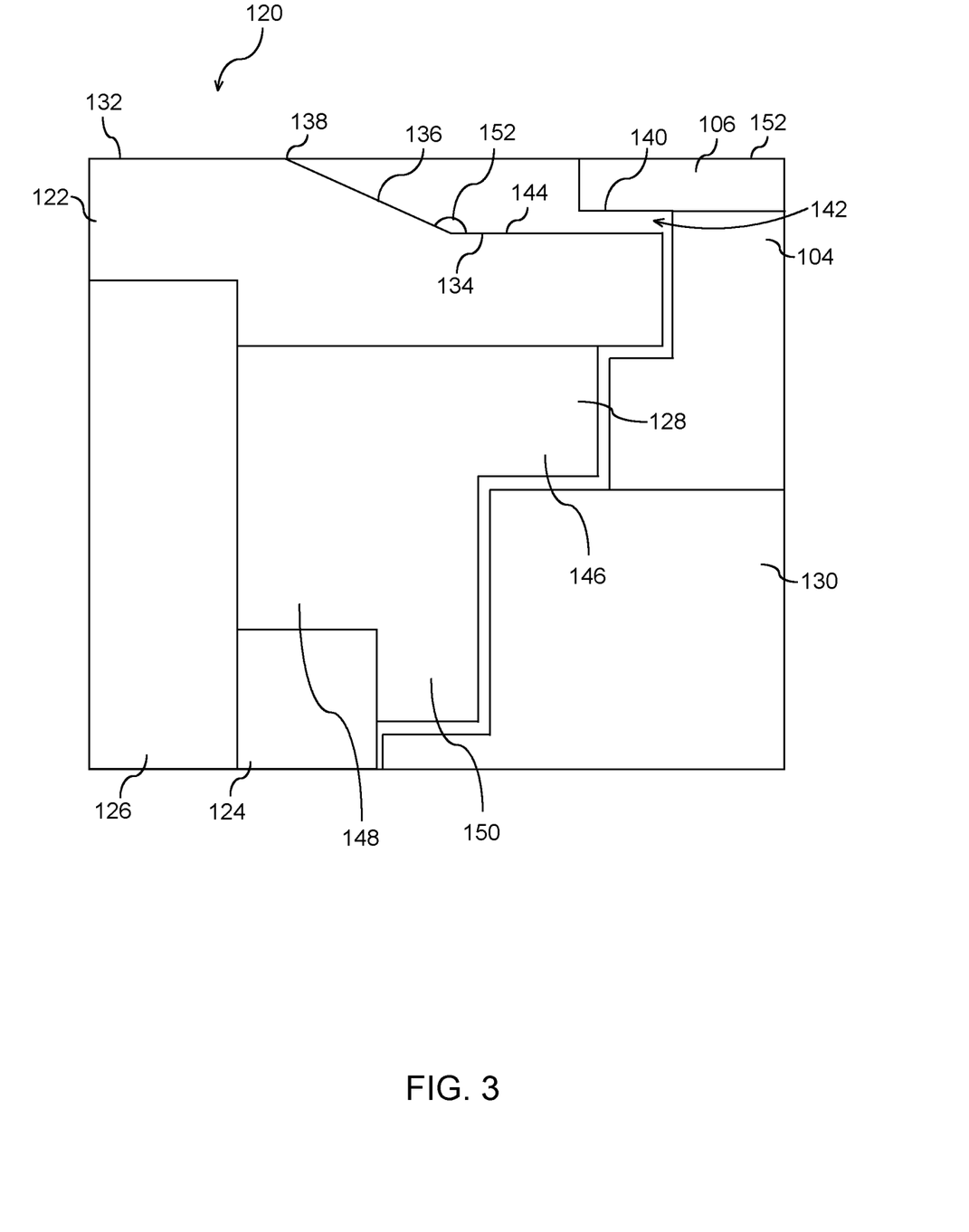
FIG. 3 depicts a cross sectional view of a workpiece support and focus ring assembly according to example embodiments of the present disclosure.

FIG. 3 depicts a cross section of a focus ring assembly 120 according to example embodiments of the present disclosure. It should be noted that the configuration of the rings which form this embodiment of the focus ring assembly is presented for illustrative purposes, and other suitable configurations or numbers of rings may be used. For instance, in some embodiments, a focus ring assembly can include a focus ring and a shadow ring. The shadow ring is generally located adjacent an outer wall of the process chamber and the focus ring generally located between the shadow ring and the workpiece holder.

Referring to FIG. 3, an embodiment of a focus ring assembly 120 can include a focus ring 122, an inner ring 124, an outer ring 126, and an upper ring 128. The focus ring assembly 120 may be configured to encircle a workpiece 106 on a workpiece support 104. The workpiece support 104 may be bonded to a baseplate 130 or the workpiece support may be removably attached to the baseplate 130.

Focus ring 122 has an upper tier 132 and a lower tier 134. The upper tier 132 connects to a side wall 136 at an upper tier inner edge 138. The workpiece 106 may overhang the workpiece support 104 and may form a gap 142 between a bottom surface 140 of the workpiece 106 and a top surface 144 the lower tier 134 of the focus ring 122. In some embodiments, the distance of overhang of the workpiece 106 can be in the range of about 1.5 mm to about 2.0 mm. The present inventors have discovered that while this greater distance of overhang may reduce the number of devices that can be formed on a workpiece, a distance of overhang of the workpiece in this range can reduce material deposition on a bottom surface of the workpiece during processing. The reduced material deposition can lead to greater device yield per workpiece.

While the focus ring 122, inner ring 124, outer ring 126, and upper ring 128 have been displayed in this embodiment in the current configuration, it is within the scope of the disclosure that the focus ring assembly may have at least one ring, such as at least two rings, such as at least three rings, such as at least four rings, such as at least five rings, or such as less than ten rings, such as less than 9 rings, such as less than 8 rings, such as less than 7 rings, such as less than 6 rings.

FIG. 3 shows an embodiment of a focus ring 122 that includes a stepped or ramped side wall 136 between an upper tier 132 and lower tier 134 of the focus ring 122. In some embodiments, the focus ring 122 may have a much greater thickness, such that the focus ring assembly consists of an outer ring and a focus ring, the focus ring extending vertically down to the baseplate and being disposed between an outer ring and a workpiece support. In yet another embodiment, the focus ring 122 may have an upper tier 132 which is generally planar with an upper surface of the workpiece 152 or alternatively may have an upper tier 132 which may be generally below an upper surface of the workpiece 152, or may have an upper tier 132 which may generally be above an upper surface of the workpiece 152.

A focus ring assembly 120 such as shown in FIG. 3 can have an upper ring 128 which may be embodied by a ring which has a narrower upper portion 146 and a larger lower portion 148 and a step portion 150 which engages or associates with the baseplate 104. In another embodiment, the upper ring 128 may have a shape more similar to that of the inner ring 124 displayed in FIG. 3 and the inner ring 124 may extend vertically up to the focus ring 122. Alternatively the ring system may not contain an upper ring. In some embodiment the upper ring 128 may be made of an insulating material, erosion resistant material, or generally unreactive material. In some embodiments, the upper ring 128 is made of quartz.

A focus ring assembly 120 can have an outer ring 126 which is generally adjacent to a side wall 110 of a workpiece processing apparatus 100. Alternatively, the outer ring 126 may extend from the side wall 110 of a workpiece processing apparatus 100 to the base plate 130. In yet another embodiment, the outer ring 126 may have a height which extends above a focus ring 122, placing the focus ring 122 generally between the outer ring 126 and the workpiece support 104. In some embodiments, the outer ring 126 may be made of an insulating material, more specifically the outer ring 126 may be made of yttria.

The focus ring assembly 120 have an inner ring 124 which is generally disposed adjacent to a baseplate 130. In one embodiment, an inner ring may be adjacent to an upper ring 128 and may have an upper edge or a side edge, either of which may engage a portion of an upper ring 128. In another embodiment, the inner ring 124 may have a width which extends from outer ring 126 to workpiece support 104. Alternatively, inner ring 124 may have a height which may engage focus ring 122. In some embodiments, the inner ring 124 may be made of an insulating material, erosion resistant material, or generally unreactive material. In one embodiment, the inner ring is made of quartz.

The focus ring assembly 120 of FIG. 3 shows a side wall 136, which connects an upper tier 132 and a lower tier 134 of the focus ring 122. FIG. 3 portrays the side wall 135 as having an angle 152. The angle 152 between side wall 136 and bottom tier 134 may be at least about 90°, such as at least about 100°, such as at least about 110°, such as at least about 120°, such as at least about 140°, such as at least about 150°, such as at least about 160°, such as least about 170°. Angle 152 may be less than about 180°, such as less than about 170°, such as less than about 160°, such as less than about 150°, such as less than about 140°, such as less than about 130°, such as less than about 120°, such as less than about 110°. In some embodiments, angle 152 may be in a range of about 100° to about 150°. IN some embodiments, the angle 152 may be about 90°.

Figure 4:
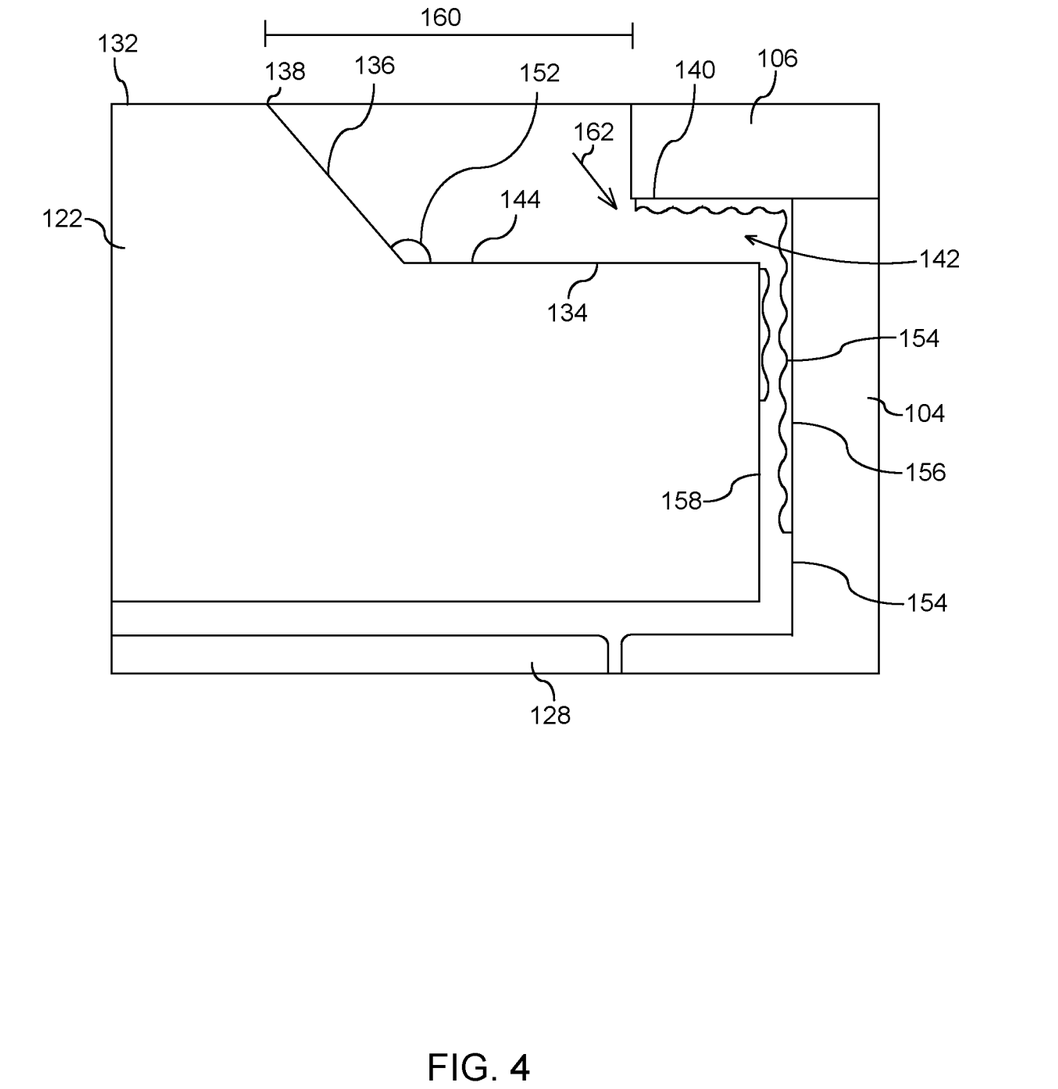
FIG. 4 depicts a close up a workpiece support and focus ring assembly according to example embodiments of the present disclosure.

FIG. 4 shows a close up view of the focus ring assembly 120 of FIG. 3. Workpiece 106 may extend past workpiece support 104 creating a gap 142 between a bottom surface of the workpiece 140 and a top surface of the lower tier 144. Through repeated processing of workpieces, material deposit 154 may accumulate on an inner side of workpiece support 156, a bottom side of a workpiece 140, or on an inner side of the lower tier 158, as well as other locations within gap 142. This material may flake off during processing, damaging the workpiece or affecting the plasma intensity and may accumulate to a point where material deposit 154 completely blocks the gap 142, potentially disrupting the flow of a coolant or blocking circulation.

FIG. 4 shows that an inner side of an upper edge 138 of the focus ring 122 generally has a lateral distance 160 from workpiece 106 of at least about 3 mm, such as at least about 4 mm, such as at least about 5 mm, such as at least about 6 mm, such as at least about 7 mm, such as at least about 8 mm, such as at least about 9 mm, such as less than 30 mm, such as less than 20 mm, such as less than 10 mm, or any range that may be selected from any 1 mm increments therein. In some embodiments, the lateral distance can have a ratio of 4:1 with a thickness of a workpiece. According to example embodiments, it has unexpectedly discovered that the increased lateral distance can decrease the accumulation of material and/or allow for a line of sight and cleaning during workpiece processing such that material deposit is decreased.

The focus ring assembly 120 of FIG. 4 may have a viewing angle 162 which allows a line of sight into the gap 142 during processing of a workpiece 106. In some embodiments, a user may view material deposit 154 during processing of a workpiece 106. Possible viewing angle 162 may provide a space to view and clean material deposit 154 during processing of a workpiece 106. Aspects of the present disclosure may provide a method to utilize the disclosed workpiece processing chamber 100 to prevent or lessen material deposit 154.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A workpiece processing apparatus for processing a workpiece, comprising:
    a plasma source configured to generate a plasma;
    a chamber configured to receive the workpiece;
    a workpiece support contained in the chamber and configured to support the workpiece;
    a baseplate configured to support the workpiece support; and
    a focus ring assembly, the focus ring assembly comprising:
        a focus ring having an upper tier, a lower tier, and a side wall extending between the upper tier and the lower tier of the focus ring;
        an outer ring adjacent to a side wall of the chamber;
        an inner ring, the inner ring being positioned laterally in the ring assembly between the outer ring and the baseplate; and
        an upper ring, the upper ring being positioned laterally in the ring assembly between the outer ring and the baseplate and being vertically positioned between the baseplate and the focus ring,
    wherein an inner edge of the upper tier is separated a lateral distance of at least about 3 mm from an outer edge of the workpiece located on the workpiece support,
    wherein an angle between the side wall and an upper surface of the lower tier is obtuse, wherein the side wall of the focus ring is laterally adjacent to at least a portion of a side wall of the workpiece located on the workpiece support,
    wherein the outer ring is comprised of a first material, the inner ring is comprised of a second material, and the upper ring is comprised of a third material, at least the first material being different from the second material and the third material, and
    wherein the outer ring is laterally spaced apart from the baseplate such that the outer ring does not contact the baseplate, the inner ring and the upper ring being positioned laterally between the outer ring and the baseplate;

wherein a top surface of the upper tier of the focus ring is substantially planar with a top surface of the workpiece.

2. The workpiece processing apparatus of claim 1, wherein the lateral distance is at least about 6 mm.

3. The workpiece processing apparatus of claim 1, wherein the lateral distance is in a range from at least about 7 mm to about 15 mm.

4. The workpiece processing apparatus of claim 1, wherein the angle between the side wall and an upper surface of the lower tier is in the range from about 100 degrees to about 150 degrees.

5. The workpiece processing apparatus of claim 1, wherein the focus ring comprises silicon.

6. The workpiece processing apparatus of claim 1, wherein the focus ring comprises yttria.

7. The workpiece processing apparatus of claim 1, wherein workpiece support comprises an electrostatic chuck bonded to the baseplate.

8. The workpiece processing apparatus of claim 1, wherein the inner ring comprises quartz.

9. The workpiece processing apparatus of claim 1, wherein the upper ring comprises quartz.

10. The workpiece processing apparatus of claim 1, wherein the outer ring comprises an insulating material.

11. The workpiece processing apparatus of claim 1, wherein the outer ring comprises yttria.

12. The workpiece processing apparatus of claim 1, wherein an edge of the workpiece overhangs an edge of the workpiece support to define a gap between an upper surface of the lower tier of the focus ring and a bottom surface of the workpiece.

13. The workpiece processing apparatus of claim 12, wherein the focus ring defines a viewing angle into the gap.

14. The workpiece processing apparatus of claim 1, wherein the workpiece located on the workpiece support overhangs the workpiece support by at least 1.5 mm.

15. The workpiece processing apparatus of claim 14, wherein the workpiece located on the workpiece support overhangs the workpiece support by up to 2 mm.

16. The workpiece processing apparatus of claim 1, wherein the focus ring assembly is self-supported in the processing chamber relative to the workpiece support.

* * * * *